(12) United States Patent
Nagata

(10) Patent No.: US 12,125,521 B2
(45) Date of Patent: Oct. 22, 2024

(54) SEMICONDUCTOR DEVICE HAVING SENSE AMPLIFIER EQUIPPED WITH COMPENSATION CIRCUIT

(71) Applicant: MICRON TECHNOLOGY, INC., Boise, ID (US)

(72) Inventor: Kyoichi Nagata, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 262 days.

(21) Appl. No.: 17/821,775

(22) Filed: Aug. 23, 2022

(65) Prior Publication Data

US 2024/0071472 A1     Feb. 29, 2024

(51) Int. Cl.
*G11C 11/4091*     (2006.01)

(52) U.S. Cl.
CPC .................. *G11C 11/4091* (2013.01)

(58) Field of Classification Search
CPC .............. G11C 11/4091; G11C 11/4094
See application file for complete search history.

(56) References Cited

FOREIGN PATENT DOCUMENTS

JP    2005025768 A   *   1/2005   ......... G06F 13/4243

OTHER PUBLICATIONS

Signal Transmission System, Its Receiver Circuit, and Semiconductor Storage Device To Which the System is Applied (Year: 2004).*

* cited by examiner

*Primary Examiner* — Sultana Begum
(74) *Attorney, Agent, or Firm* — Dorsey & Whitney LLP

(57) ABSTRACT

An apparatus that includes a sense amplifier including first and second cross-coupled transistors to amplify a potential difference between first and second digit lines, a compensation circuit configured to compensate a threshold difference between the first and second transistors, first and second local I/O lines coupled to the first and second digit lines, respectively, and an equalizing circuit configured to equalize the first and second local I/O lines. The equalizing circuit is configured to change a precharge level of the first and second local I/O lines from a first potential to a second potential before a compensation operation of the compensation circuit is completed.

20 Claims, 7 Drawing Sheets

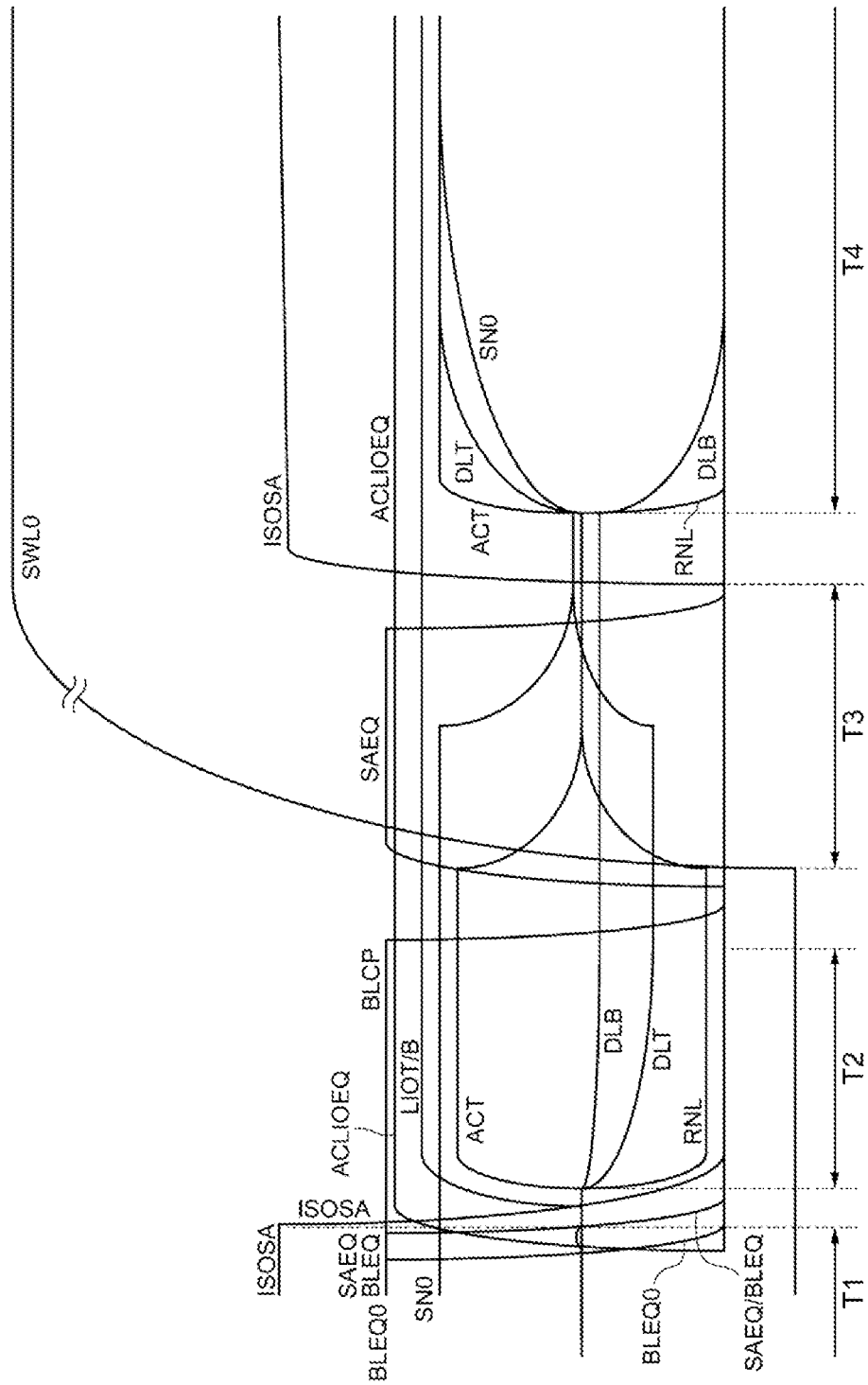

SEMICONDUCTOR DEVICE HAVING SENSE AMPLIFIER EQUIPPED WITH COMPENSATION CIRCUIT

BACKGROUND

A sense amplifier used in a semiconductor memory device such as a DRAM (Dynamic Random Access Memory) amplifies a potential difference occurring between a pair of digit lines and transfers amplified data to a pair of local I/O lines. However, when a global I/O line is of a single end type, the precharge level of the local I/O lines sometimes differs from the precharge level of the digit lines. In this case, coupling noise may be superimposed on the digit lines at the time of precharging the local I/O lines.

BRIEF DESCRIPTION OF THE DRAWINGS

FIG. 7 is a waveform chart for explaining an operation of sense amplifiers according to the modification.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
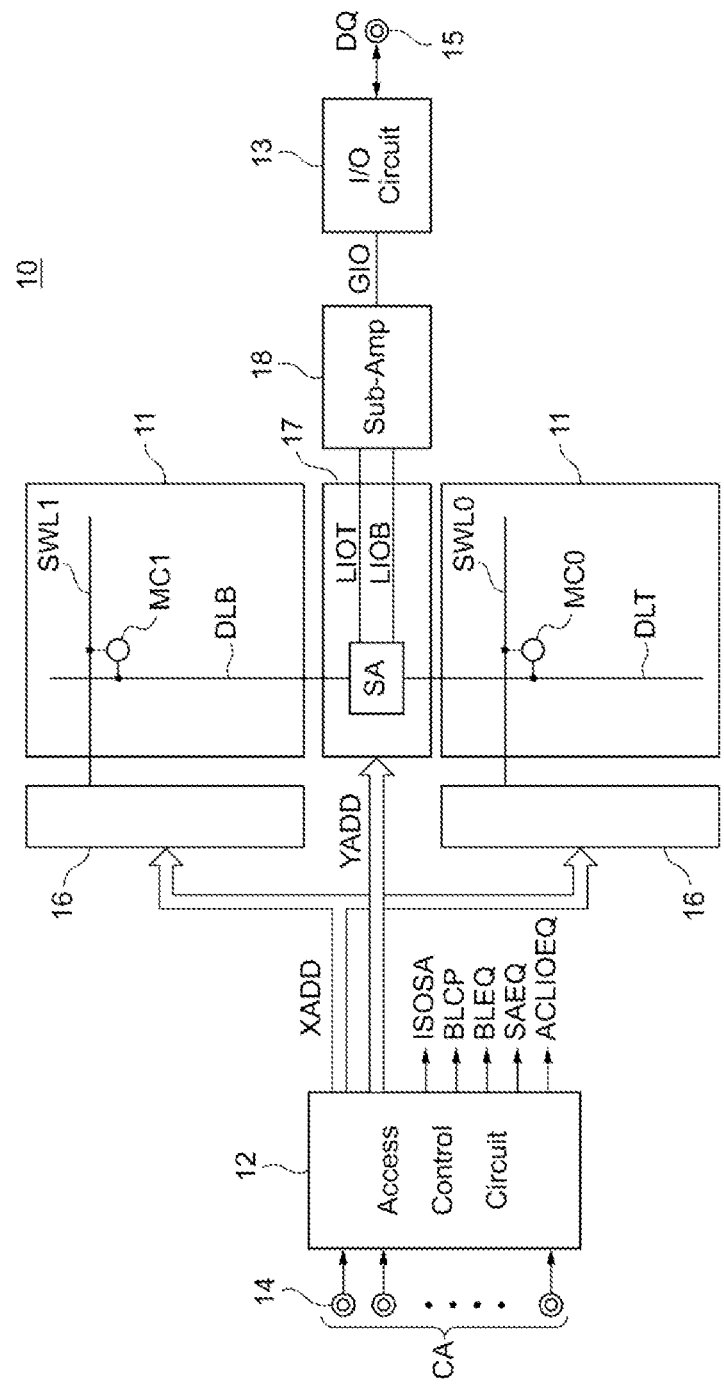
FIG. 1 is a block diagram illustrating a configuration of a semiconductor memory device according to the present disclosure.

FIG. 1 is a block diagram illustrating a configuration of a semiconductor memory device 10 according to the present disclosure. The semiconductor memory device 10 shown in FIG. 1 is, for example, a DRAM and includes a memory cell array 11, an access control circuit 12 that performs an access to the memory cell array 11, and an I/O circuit 13 that performs an input/output of data to/from the memory cell array 11. The access control circuit 12 performs an access to the memory cell array 11 on the basis of a command address signal CA input from an external controller through a command address terminal 14. At the time of a read operation, data DQ that is read from the memory cell array 11 is output to a data I/O terminal 15 via the I/O circuit 13. At the time of a write operation, data DQ that is input to the data I/O terminal 15 from an external controller is written to the memory cell array 11 via the I/O circuit 13.

A row address XADD included in the command address signal CA is supplied to a row control circuit 16. The row control circuit 16 selects any of sub-word lines SWL0, SWL1, . . . included in the memory cell array 11 on the basis of the row address XADD. A column address YADD included in the command address signal CA is supplied to a column control circuit 17. The column control circuit 17 selects any of sense amplifiers SA on the basis of the column address YADD. The sense amplifier SA amplifies a potential difference occurring between a pair of digit lines DLT and DLB. Memory cells MC are arranged at intersections between sub-word lines SWL and the digit lines DLT and DLB, respectively. A memory cell MC0 arranged at an intersection between a sub-word line SWL0 and the digital line DLT, and a memory cell MC1 arranged at an intersection between a sub-word line SWL1 and the digit line DLB are shown in FIG. 1. The signal amplified by the sense amplifier SA is transferred to a pair of local I/O lines LIOT and LIOB. The signal transferred to the local I/O lines LIOT and LIOB is transferred to a global I/O line GIO via a sub-amplifier 18. The global I/O line GIO is single-ended. The signal transferred to the global I/O line GIO is supplied to the I/O circuit 13.

Figure 2:
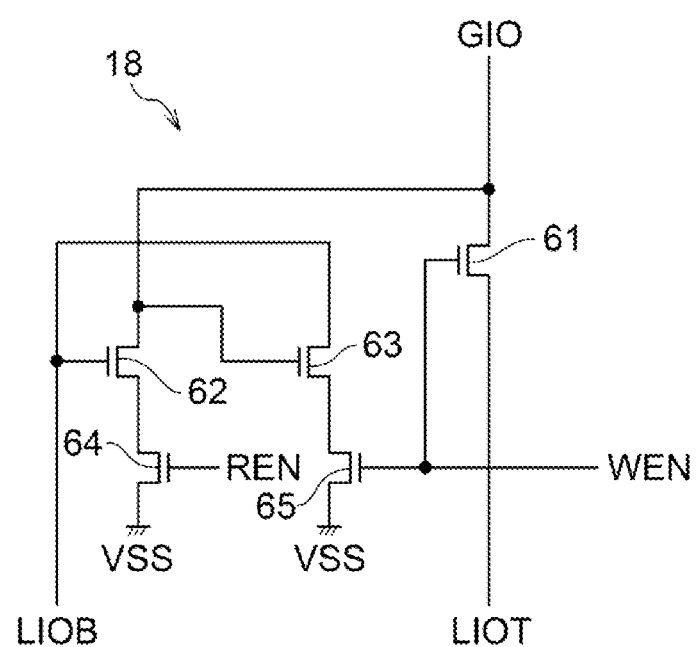
FIG. 2 is a circuit diagram of a sub-amplifier.

FIG. 2 is a circuit diagram of the sub-amplifier 18. As shown in FIG. 2, the sub-amplifier 18 includes N-channel MOS transistors 61 to 65. The transistor 61 is coupled between the local I/O lines LIOT and the global I/O line GIO and the gate electrode thereof is supplied with a write enable signal WEN. The transistors 62 and 64 are coupled in series between the global I/O line GIO and a power line supplied with a ground potential VSS. The gate electrode of the transistor 62 is coupled to the local I/O lines LIOB. A read enable signal REN is supplied to the gate electrode of the transistor 64. The transistors 63 and 65 are coupled in series between the local I/O lines LIOB and the power line supplied with the ground potential VSS. The gate electrode of the transistor 63 is coupled to the global I/O line GIO. The write enable signal WEN is supplied to the gate electrode of the transistor 65. With this configuration, when the level of the global I/O line GIO is a high level at the time of a write operation, the transistors 61, 63, and 65 are turned on and therefore the local I/O lines LIOT are brought into a high level and the local I/O lines LIOB are brought into a low level. In contrast thereto, when the level of the global I/O line GIO is a low level at the time of a write operation, the transistors 61 and 65 are turned on and therefore the local I/O lines LIOT are brought into a low level while the local I/O lines LIOB are maintained in a precharged state (a high level). When the local I/O lines LIOT are at a high level and the local I/O lines LIOB are at a low level at the time of a read operation, the transistor 64 is turned on. However, since the transistor 62 is in an off state, the global I/O line GIO is maintained in the precharged state (a high level). In contrast thereto, when the local I/O lines LIOT are at a low level and the local I/O lines LIOB are at a high level at the time of a read operation, the transistors 62 and 64 are turned on and therefore the global I/O line GIO is brought into a low level. In this way, the sub-amplifier 18 converts a signal of a differential form into that of a single-end form at the time of a read operation and converts a signal of the single end form to that of the differential form at the time of a write operation.

Figure 3:
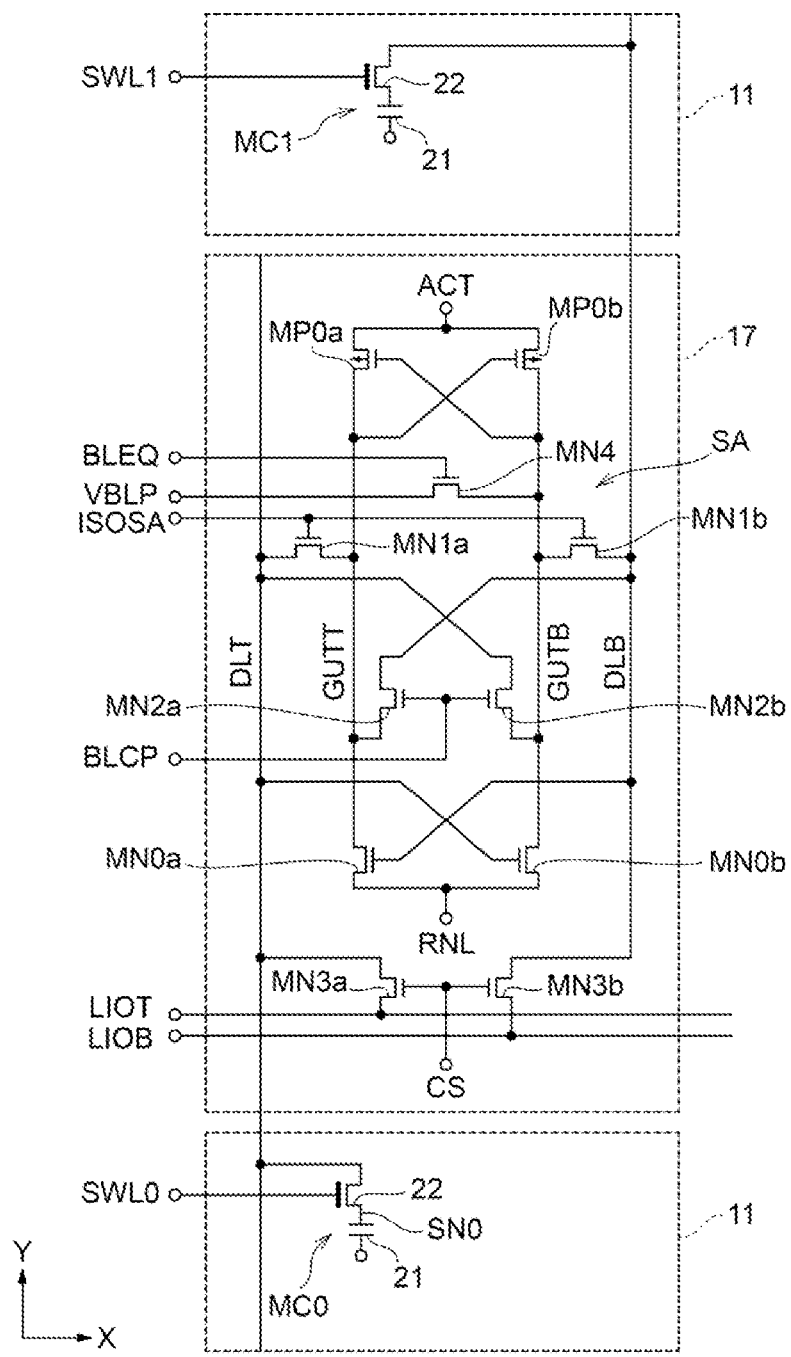
FIG. 3 is a circuit diagram of sense amplifiers.

FIG. 3 is a circuit diagram of the sense amplifiers SA. As shown in FIG. 3, each of the sense amplifiers SA includes a cross-coupled N-channel MOS transistors MN0a and MN0b, and cross-coupled P-channel MOS transistors MP0a and MP0b. A source potential RNL is supplied to the sources of the transistors MN0a and MN0b and a source potential ACT is supplied to the sources of the transistors MP0a and MP0b. The gate electrode of the transistor MN0a is coupled to the associated digit line DLB and the gate electrode of the transistor MN0b is coupled to the associated digit line DLT. The drain of the transistor MN0a is coupled to an internal line GUTT and the drain of the transistor MN0b is coupled to an internal line GUTB. The internal line GUTT is coupled to the drain of the transistor MP0a and the gate electrode of the transistor MP0b and is also coupled to the digit line DLT via an N-channel MOS transistor MN1a. The internal line GUTB is coupled to the drain of the transistor MP0b and the gate electrode of the transistor MP0a and is also coupled to the digit line DLB via an N-channel MOS transistor MN1b. A control signal ISOSA is supplied in common to the gate electrodes of the transistors MN1a and MN1b. With this configuration, when the source potential RNL is driven to a low level and the source potential ACT is driven to a high level in a state in which the control signal ISOSA is activated to a high level, a potential difference occurring between the digit lines DLT and DLB is amplified by the sense amplifier SA. The memory cells MC0, MC1, . . . each including a cell capacitor 21 and a cell transistor 22 are coupled to the digit lines DLT and DLB, respectively, and a potential difference occurs between the digit lines DLT and DLB when any of the sub-word lines SWL0, SWL1, . . . is selected on the basis of the row address XADD. When a column switch including N-channel MOS transistors MN3a and MN3b is turned on by activation of a column selection signal CS on the basis of the column address YADD, a pair of the digit lines DLT and DLB are connected to a pair of the local I/O lines LIOT and LIOB, respectively. The digit lines DLT and DLB extend in a Y direction and the local I/O lines LIOT and LIOB extend in an X direction. Therefore, the digit lines DLT and DLB intersect with the local I/O lines LIOT and LIOB, respectively, and a floating capacitance is generated at the intersecting portions.

Figure 4:
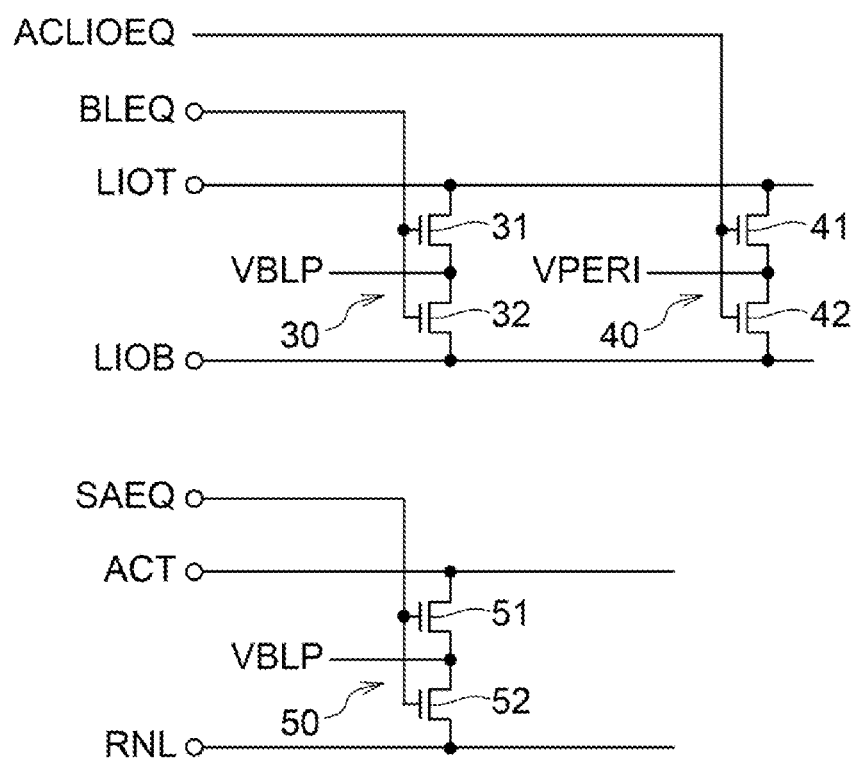
FIG. 4 is a circuit diagram of an equalizing circuit.

Each of the sense amplifiers SA further includes N-channel MOS transistors MN2a and MN2b. The transistor NM2a is coupled between the internal line GUTT and the digit line DLB. The transistor MN2b is coupled between the internal line GUTB and the digit line DLT. A control signal BLCP is supplied in common to the gate electrodes of the transistors MN2a and MN2b. The transistors MN2a and MN2b constitute a compensation circuit that compensates a difference in the threshold voltage between the transistors MN0a and MN0b. Each of the sense amplifiers SA further includes an N-channel MOS transistor MN4. A control signal BLEQ is supplied to the gate electrode of the transistor MN4. When the control signal BLEQ is activated to a high level, an array potential VBLP is supplied to the internal line GUTB. The array potential VBLP corresponds to an intermediate potential between the source potential ACT and the source potential RNL. The control signal BLEQ is also used for precharging of the local I/O lines LIOT and LIOB. As shown in FIG. 4, an equalizing circuit 30 including N-channel MOS transistors 31 and 32 is coupled between the local I/O lines LIOT and LIOB, and the local I/O lines LIOT and LIOB are precharged with the array potential VBLP when the control signal BLEQ is activated to a high level. Another equalizing circuit 40 including N-channel MOS transistors 41 and 42 is coupled between the local I/O lines LIOT and LIOB and the local I/O lines LIOT and LIOB are precharged with a power potential VPERI when a control signal ACLIOEQ is activated to a high level. The power potential VPERI is a potential used by peripheral circuits and is higher than the array potential VBLP. An equalizing circuit 50 including N-channel MOS transistors 51 and 52 is coupled between a line supplied with the source potential ACT and a line supplied with the source potential RNL and the source potentials ACT and RNL are fixed to the array potential VBLP when a control signal SAEQ is activated to a high level. These control signals ISOSA, BLCP, BLEQ, SAEQ, and ACLIOEQ are generated by the access control circuit 12 shown in FIG. 1.

Figure 5:
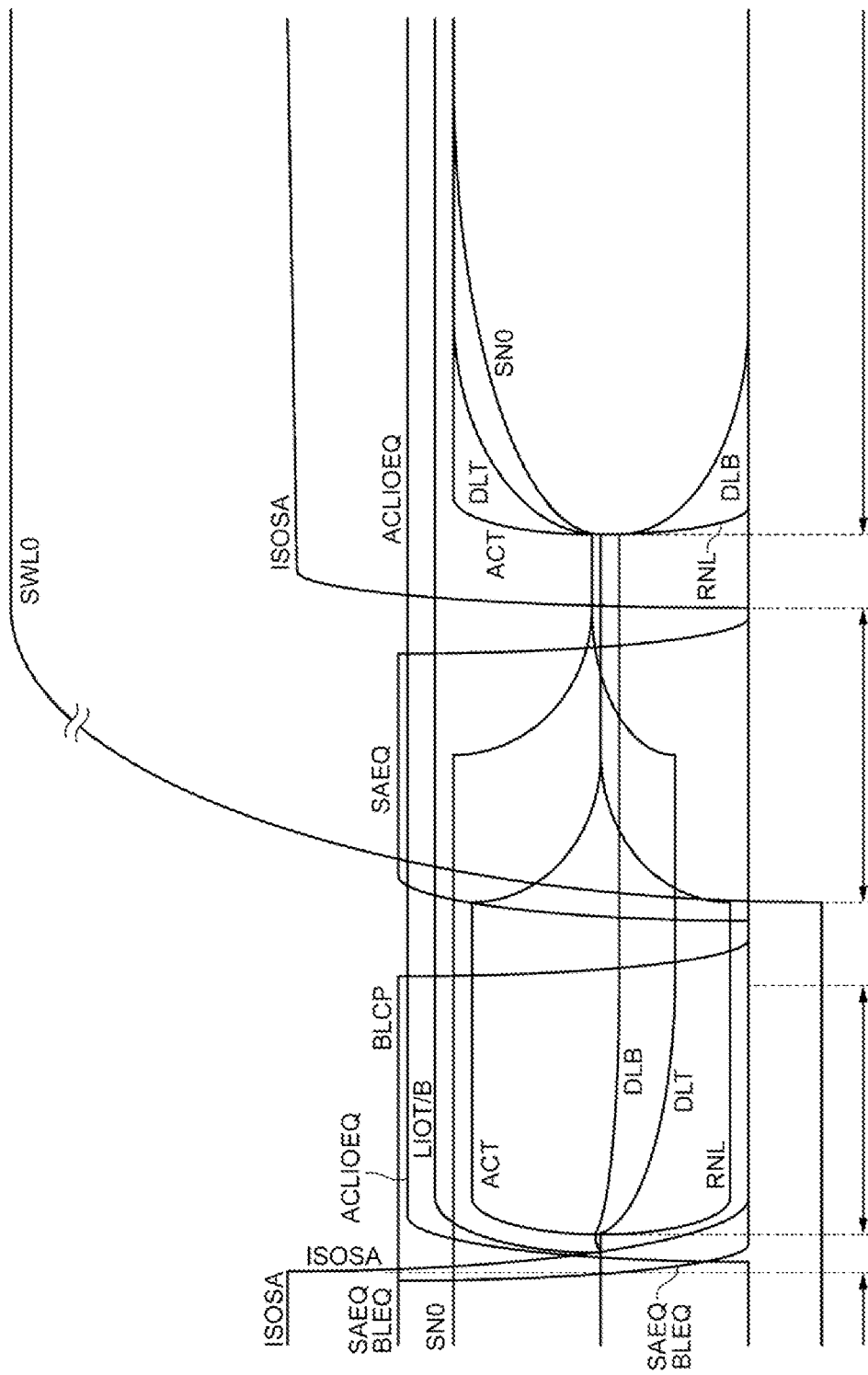
FIG. 5 is a waveform chart for explaining an operation of the sense amplifiers.

FIG. 5 is a waveform chart for explaining an operation of the sense amplifiers SA. As shown in FIG. 5, the operation of the sense amplifiers SA is divided into four periods T1 to T4. The period T1 is a standby period, and the control signals ISOSA, BLCP, BLEQ, and SAEQ are brought into a high level and the control signal ACLIOEQ is brought into a low level in this period. Accordingly, the local I/O lines LIOT and LIOB are precharged with the array potential VBLP by the equalizing circuit 30 and the source potentials ACT and RNL are also fixed to the array potential VBLP. Further, since the transistors MN1a, MN1b, and MN4 are turned on, the internal lines GUTT and GUTB and the digit lines DLT and DLB are also precharged with the array potential VBLP.

The period T2 is a threshold voltage compensation period, and the control signals ACLIOEQ and BLCP are brought into a high level and the control signals ISOSA, BLEQ, and SAEQ are brought into a low level in this period. Accordingly, the precharge level of the local I/O lines LIOT and LIOB is changed from the array potential VBLP to the power potential VPERI and the source potentials ACT and RNL are supplied to the sense amplifiers SA. When the precharge level of the local I/O lines LIOT and LIOB is changed from the array potential VBLP to the power potential VPERI, the levels of the digit lines DLT and DLB slightly fluctuate due to the floating capacitance occurring between the local I/O lines LIOT and LIOB and the digit lines DLT and DLB. Since the transistors MN1a and MN1b are off in this period, the internal lines GUTT and GUTB are disconnected from the digit lines DLT and DLB. Since the control signal BLCP is at a high level, the gate electrode and the drain of the transistor MN0a are short-circuited via the transistor MN2a and the gate electrode and the drain of the transistor MN0b are short-circuited via the transistor MN2b. Accordingly, the transistors MN0a and MN0b are both brought into a diode-connected state, so that the internal line GUTT has a level obtained by adding the threshold voltage of the transistor MN0b to the source potential RNL. That is, a potential difference corresponding to a threshold voltage difference between the transistors MN0a and MN0b occurs between the internal lines GUTT and GUTB. This potential difference is reflected in the digit lines DLT and DLB via the transistors MN2a and MN2b, whereby the compensation operation of the compensation circuit including the transistors MN0a and MN0b is completed. In this case, the potential of the internal line GUTT is reflected in the digit line DLB and the potential of the internal line GUTB is reflected in the digit line DLT. Therefore, fluctuations in the levels of the digit lines DLT and DLB caused by the change of the precharge level of the local I/O lines LIOT and LIOB from the array potential VBLP to the power potential VPERI are also reduced by this compensation operation. In the example shown in FIG. 5, the level of the digit line DLT is lowered than that of the digit line DLB by the compensation operation performed in the period T2.

The period T3 is a read period, and a sub-word line SWL designated by the row address XADD is activated, the control signals ACLIOEQ and SAEQ are brought into a high level, and the control signals ISOSA, BLEQ, and BLCP are brought into a low level in this period. In this way, a sub-word line SWL is activated after the compensation operation of the compensation circuit including the transistors MN0a and MN0b is completed. In the example shown in FIG. 5, the sub-word line SWL0 is activated and a signal node SN0 of the memory cell MC0 selected by the sub-word line SWL0 has high-level data retained therein. Therefore, when the sub-word line SWL0 is activated, the level of the digit line DLT coupled to the memory cell MC0 is increased to be higher than the level of the digit line DLB.

The period T4 is a sensing period, and the control signals ISOSA and ACLIOEQ are brought into a high level and the control signals SAEQ, BLEQ, and BLCP are brought into a low level in this period. Accordingly, the digit lines DLT and DLB are respectively connected to the internal lines GUTT and GUTB of each of the sense amplifiers SA and the source potentials ACT and RNL are supplied to the sense amplifiers SA. As a result, a potential difference occurring between the digit lines DLT and DLB is amplified by the sense amplifiers SA and the high-level data is rewritten to the cell capacitor 21 of the memory cell MC0. The column selection signal CS is subsequently activated in a timing when the potential difference between the digit lines DLT and DLB is sufficiently amplified, whereby the digit lines DLT and DLB are connected to the local I/O lines LIOT and LIOB, respectively. The sub-amplifier 18 shown in FIG. 1 drives the single-ended global I/O line GIO on the basis of the data transferred to the local I/O lines LIOT and LIOB. The level of the global I/O line GIO is the ground potential VSS or the power potential VPERI.

In this way, the semiconductor memory device according to the present embodiment changes the precharge level of the local I/O lines LIOT and LIOB from the array potential VBLP to the power potential VPERI before the compensation operation performed in the period T2 is completed. Therefore, influences of potential fluctuations occurring in the digit lines DLT and DLB due to the floating capacitance can be reduced.

Figure 6:
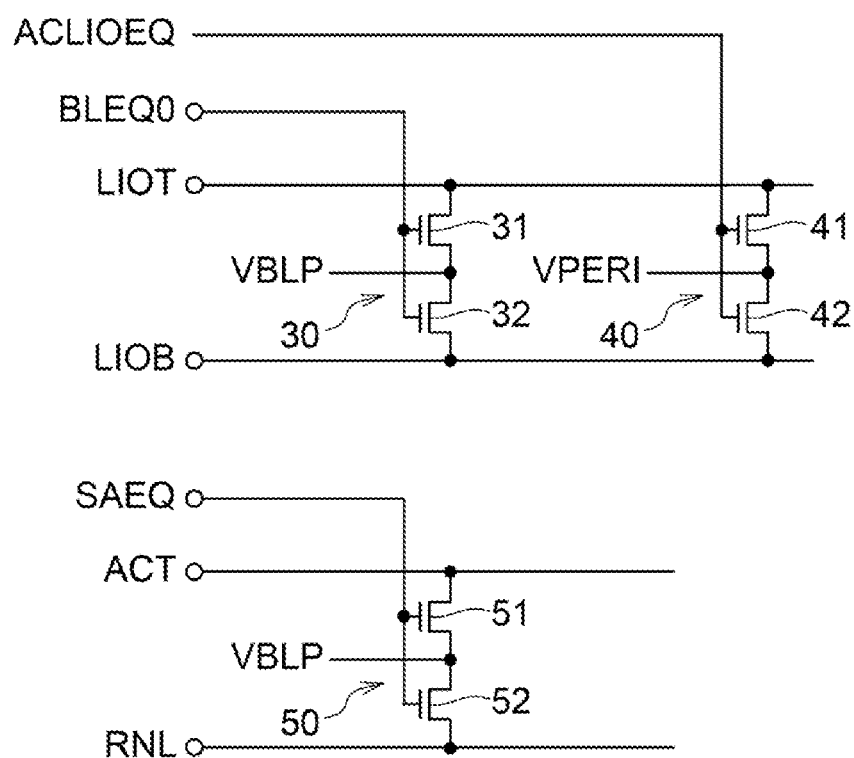
FIG. 6 is a circuit diagram of an equalizing circuit according to a modification.

FIG. 6 is a circuit diagram of an equalizing circuit according to a modification. As shown in FIG. 6, a control signal BLEQ0 is used in the equalizing circuit 30 in the modification. The control signal BLEQ0 is a signal that transitions slightly prior to the control signal BLEQ.

FIG. 7 is a waveform chart for explaining an operation of the sense amplifiers SA according to the modification. In the example shown in FIG. 7, an operation performed between the period T1 being the standby period and the period T2 being the compensation period is different from that shown in FIG. 5. The rest of the operation is same as that shown in FIG. 5. As shown in FIG. 7, the control signal BELQ0 input to the equalizing circuit 30 transitions from a high level to a low level slightly prior to the control signal BLEQ0 input to the sense amplifiers SA. Accordingly, even when the levels of the digit lines DLT and DLB fluctuate due to a change of the precharge level of the local I/O lines LIOT and LIOB from the array potential VBLP to the power potential VPERI, the equalizing operation for the digit lines DLT and DLB via the transistor MN4 is subsequently performed. Therefore, the level fluctuations in the digit lines DLT and DLB resulting from the floating capacitance can be almost completely cancelled.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:
a sense amplifier including first and second cross-coupled transistors to amplify a potential difference between first and second digit lines;
a compensation circuit configured to perform an operation to compensate a threshold difference between the first and second cross-coupled transistors;
first and second local I/O lines coupled to the first and second digit lines, respectively; and
an equalizing circuit configured to equalize the first and second local I/O lines,
wherein the equalizing circuit is configured to change a precharge level of the first and second local I/O lines from a first potential to a second potential before the compensation circuit completes the operation.

2. The apparatus of claim 1, wherein the second potential is higher than the first potential.

3. The apparatus of claim 1,
wherein the equalizing circuit is configured to bring the first and second local I/O lines to the first potential responsive to a first signal and bring the first and second local I/O lines into the second potential responsive to a second signal, and
wherein the sense amplifier is configured to bring the first and second digit lines to the first potential responsive to the first signal.

4. The apparatus of claim 3, wherein the sense amplifier is configured to bring a source of the first and second transistors to the first potential responsive to a third signal different from the first signal.

5. The apparatus of claim 4, wherein the second and third signals are in an active state after the operation of the compensation circuit is completed.

6. The apparatus of claim 1,
wherein the equalizing circuit is configured to bring the first and second local I/O lines to the first potential responsive to a first signal and bring the first and second local I/O lines to the second potential responsive to a second signal,
wherein the sense amplifier is configured to bring the first and second digit lines to the first potential responsive to a third signal, and
wherein the first signal is deactivated before the third signal is deactivated.

7. An apparatus comprising:
first and second digit lines coupled to first and second memory cells, respectively;
first and second word lines selecting the first and second memory cells, respectively;
a sense amplifier including first and second cross-coupled transistors to amplify a potential difference between the first and second digit lines;
a compensation circuit configured to compensate a threshold difference between the first and second transistors;
first and second local I/O lines coupled to the first and second digit lines, respectively, via a column switch;

a first equalizing circuit configured to bring the first and second local I/O lines into a first potential;

a second equalizing circuit configured to bring the first and second local I/O lines into a second potential different from the first potential; and a control circuit configured to:
 activate the first equalizing circuit during a first period;
 activate the compensation circuit during a second period following the first period;
 activate one of the first and second word lines during a third period following the second period;
 activate the sense amplifier during a fourth period following the third period; and
 activate the second equalizing circuit during the second, third, and fourth periods.

8. The apparatus of claim 7, wherein the second potential is higher than the first potential.

9. The apparatus of claim 7,
 wherein the first and second digit lines extend in a first direction, and
 wherein the first and second local I/O lines extend in a second direction perpendicular to the first direction.

10. The apparatus of claim 7, further comprising:
 a global I/O line; and
 a sub-amplifier circuit configured to drive the global I/O line based on a potential difference between the first and second local I/O lines.

11. The apparatus of claim 10, wherein the sub-amplifier circuit is configured to bring a potential of the global I/O line to the second potential.

12. The apparatus of claim 7, wherein the sense amplifier is configured to equalize the first and second digit lines responsive to a first control signal.

13. The apparatus of claim 12, wherein the first equalizing circuit is controlled by the first control signal.

14. The apparatus of claim 12, wherein the first equalizing circuit is controlled by a second control signal different from the first control signal.

15. The apparatus of claim 14, wherein a transition of the second control signal occurs prior to a transition of the first control signal.

16. The apparatus of claim 15,
 wherein the second equalizing circuit is controlled by a third control signal, and
 wherein a transition of the third control signal occurs prior to a transition of the first control signal.

17. The apparatus of claim 7, wherein the control circuit is configured to activate the column switch during a fifth period following the fourth period.

18. An apparatus comprising:
 a sense amplifier including first and second cross-coupled transistors having a first conductivity type and third and fourth cross-coupled transistors having a second conductivity type to amplify a potential difference between first and second digit lines;
 a compensation circuit configured to compensate a threshold difference between the first and second transistors;
 first and second local I/O lines coupled to the first and second digit lines, respectively, via a column switch;
 a first equalizing circuit configured to equalize the first and second local I/O lines to a first potential responsive to a first control signal;
 a second equalizing circuit configured to equalize the first and second local I/O lines to a second potential different from the first potential responsive to a second control signal; and
 a third equalizing circuit configured to equalize a source of the first and second cross-coupled transistors and a source of the third and fourth cross-coupled transistors responsive to a third control signal different from the first control signal.

19. The apparatus of claim 18, wherein the first and second equalizing circuits are configured to be deactivated and activated, respectively, before a compensation operation of the compensation circuit is completed.

20. The apparatus of claim 19, wherein the sense amplifier is configured to equalize the first and second digit lines responsive to the first control signal.

* * * * *